United States Patent [19]
Lee

[11] Patent Number: 5,844,438
[45] Date of Patent: Dec. 1, 1998

[54] CIRCUIT FOR GENERATING AN INTERNAL CLOCK FOR DATA OUTPUT BUFFERS IN A SYNCHRONOUS DRAM DEVICES

[75] Inventor: Jung-Bae Lee, Kyungki-do, Rep. of Korea

[73] Assignee: Samsung Electronics, Co., Ltd., Suwon, Rep. of Korea

[21] Appl. No.: 771,198

[22] Filed: Dec. 20, 1996

[30] Foreign Application Priority Data

Dec. 23, 1995 [KR] Rep. of Korea ................ 95-55697

[51] Int. Cl.⁶ ........................................... H03K 21/00
[52] U.S. Cl. ................... 327/291; 327/293; 327/299; 327/99
[58] Field of Search .................. 327/99, 291, 293, 327/299

[56] References Cited

U.S. PATENT DOCUMENTS

| | | | |
|---|---|---|---|
| 4,748,417 | 5/1988 | Spengler | 328/72 |
| 5,136,180 | 8/1992 | Caviasca et al. | 307/269 |
| 5,243,637 | 9/1993 | Flaherty et al. | 377/95 |
| 5,483,185 | 1/1996 | Scriber et al. | 327/99 |

FOREIGN PATENT DOCUMENTS

403238913 A 10/1991 Japan ........................ 327/99

*Primary Examiner*—Toan Tran
*Assistant Examiner*—An T. Luu
*Attorney, Agent, or Firm*—Marger, Johnson, McCollom, & Stolowitz

[57] ABSTRACT

An internal clock generating circuit for data output buffers of a synchronous DRAM device, which produces an internal clock with reference to either the positive edge or the negative edge of the system clock CLK by comparing the reference time $t_{CLref(OH)}$ for insuring a low level time tCL of the system clock CLK and output hold time $t_{OH}$, and which can sufficiently insure the data output setup time $t_{OS}$ and data output hold time $t_{OH}$ regardless of the frequency of the system clock by making the generation points of the internal clock to be varied depending on the frequency of the system clock.

20 Claims, 8 Drawing Sheets

CIRCUIT FOR GENERATING AN INTERNAL CLOCK FOR DATA OUTPUT BUFFERS IN A SYNCHRONOUS DRAM DEVICES

This application corresponds to Korean patent application No. 95-55697 filed Dec. 23, 1995 in the name of Samsung Electronics Co., Ltd., which is herein incorporated by reference for all purposes.

BACKGROUND OF THE INVENTION

1. Field of the Invention

This invention relates generally to synchronous dynamic random access memory (SDRAM) devices, and more particularly to a method and apparatus for generating an internal clock signal for data output buffers in SDRAM devices.

2. Description of the Related Art

In SDRAMs, most of the internal control circuits are operated in synchronization with a system clock. This provides faster data access times than in typical DRAM devices. The response time (or response speed) $t_{RAC}$ of an SDRAM device can be determined by:

$$t_{RAC} = t_{CC}[t_{RCD} + (CL-1)] + t_{SAC} \qquad (1)$$

where $t_{RCD}$ is the delay time from the Row Address Strobe (RAS) signal to the Column Address Strobe (CAS) signal, CL is the latency time from the CAS signal until the data is output, $t_{CC}$ refers to the clock cycle time, and $t_{SAC}$ designates the delay time from a positive edge of the system clock CLK until the data is output. Hereinafter, the delay time $t_{SAC}$ will be referred to as the data output delay time.

In order to reduce the response time $t_{RAC}$ of an SDRAM, it is necessary to reduce the data output delay time $t_{SAC}$. However, in a conventional SDRAM, because an internal clock signal CLKDQ which drives the data output buffers is generated with reference to the positive (i.e., rising) edge of the system clock CLK, the data output delay time $t_{SAC}$ becomes a critical limitation to the clock cycle time $t_{CC}$.

Figure 1A:
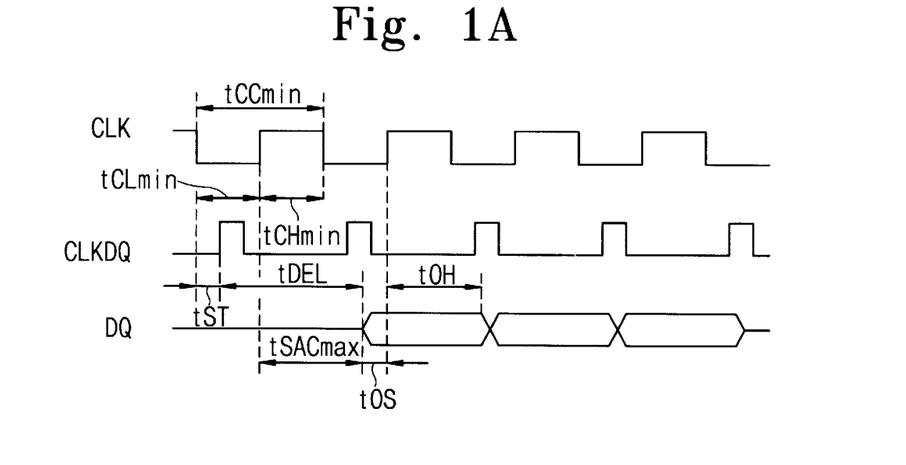
FIGS. 1A–1C are timing diagrams showing the operation of the timing parameters in a synchronous DRAM device for various system clock frequencies.

To overcome this limitation, Rambus DRAM, which is known as a high speed DRAM device, generates an internal clock TCLK (which is a counterpart to the CLKDQ signal in an SDRAM) for data output buffers about a quarter cycle early with respect to the system clock CLK as shown in FIG. 1A. In a similar manner, if the internal clock CLKDQ of the SDRAM is generated a quarter cycle ahead with reference to the negative (i.e., falling) edge of the system clock CLK, the data output delay time $t_{SAC}$ can be reduced.

However, when the data output delay time $t_{SAC}$ is reduced (i.e., when the data output delay time $t_{SAC}$ in an SDRAM is regulated to operate properly with a system clock having the highest frequency), the data output hold time requirement (for holding the data output for a prespecified time from the next positive edge of the system clock CLK) cannot be met. The data output hold condition corresponds to an output hold time $t_{OH}$ which can be regarded as a minimum data output delay time $t_{SACmin}$ and defined by a time from positive edge of the next cycle system clock CLK to the end of the data output time.

Figure 1B:
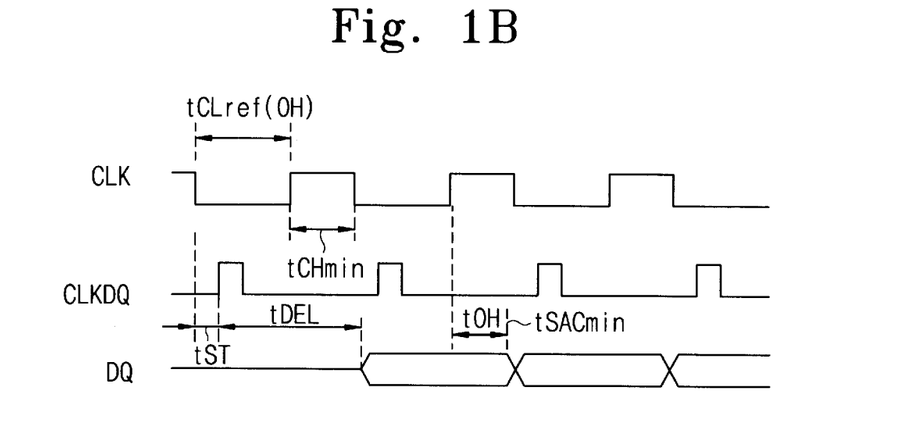
Figure 1C:
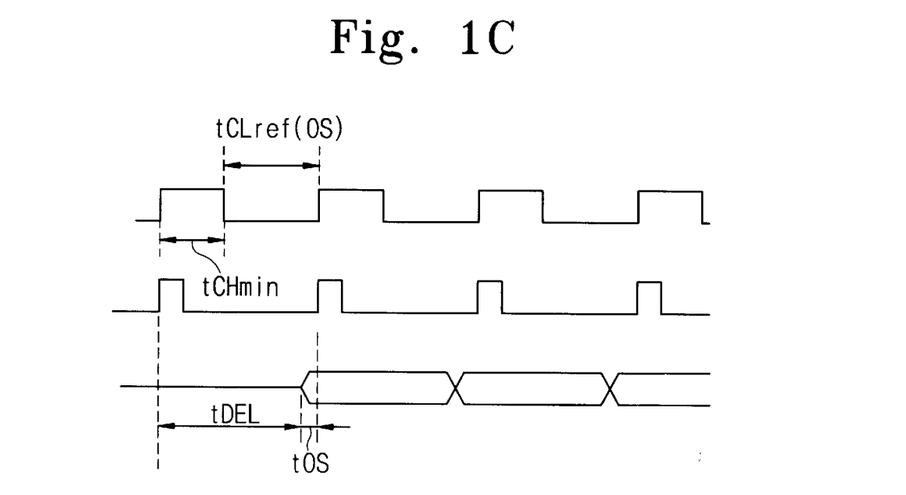

FIGS. 1A to 1C are timing diagrams that show the points at which the internal clock CLKDQ is generated in accordance with the frequency of the system clock CLK of an SDRAM. FIG. 1A shows the relationship between each AC parameter and generation point of the internal clock CLKDQ when a system clock CLK has the highest frequency within a given clock low time $t_{CL}$. An internal clock generation delay time $t_{ST}$ starts at a negative edge of the system clock CLK. An output delay time of data output buffers $t_{DEL}$ is the sum of a delay time from the generation point of the internal clock CLKDQ to the data output buffer and a data transfer delay time of the data output buffer. Further, an output setup time $t_{OS}$ is calculated by subtracting the maximum data output delay time $t_{SACmax}$ from the minimum clock cycle time $t_{CCmin}$.

As explained above, when the highest frequency system clock CLK is provided, the minimum clock cycle time $t_{CCmin}$ is given as;

$$\begin{aligned} t_{CCmin} &= t_{SACmax} + t_{OS} \qquad (2)\\ &= t_{CLmin} + t_{CHmin} \end{aligned}$$

Under these conditions, if the maximum data output delay time $t_{SACmax}$ of the SDRAM is less than the output delay time $t_{DEL}$ of the output buffer, the internal clock CLKDQ has to be generated with reference to the negative edge of the system clock CLK at a point defined by the following relationship in order to insure the maximum data output delay time $t_{SACmax}$:

$$t_{ST} <= t_{CLmin} - t_D \text{ (where, } t_D = t_{DEL} - t_{SACmax}) \qquad (3)$$

Since a larger clock generation delay time $t_{ST}$ helps guarantee the output hold time $t_{OH}$, it is preferable to set $t_{ST}$ as follows:

$$\begin{aligned} t_{ST} &= t_{CLmin} - t_D \qquad (4)\\ &= t_{CLmin} - t_{DEL} + t_{SACmax} \end{aligned}$$

The timing diagram of FIG. 1B shows several AC parameters which illustrate the difficulty of guaranteeing the output hold time $t_{OH}$ when the frequency of the system clock CLK is gradually reduced under a condition where the generation point of the internal clock CLKDQ is fixed, i.e., where $t_{ST}$ is set to a predetermined value. The low level time of the system clock CLK which is required to guarantee the $t_{OH}$ required for producing the internal clock CLKDQ for the data output buffer is denoted as $t_{CLref(OH)}$ and referred to as the 'reference output hold clock level time' or 'reference output hold time.' $t_{CLref(OH)}$ is governed by the following equation:

$$t_{CLref(OH)} = t_{CLmin} + (t_{SACmax} - t_{OH}) \qquad (5)$$

Accordingly, if the low level time $t_{CL}$ of the system clock CLK is less than the reference output hold clock low level time $t_{CLref(OH)}$, the internal clock CLKDQ can be generated with reference to the negative edge of the system clock CLK. If instead, the low level time $t_{CL}$ of the system clock CLK is greater than the reference output hold clock low level time $t_{CLref(OH)}$, the internal clock CLKDQ can simply be generated with reference to the positive edge of the system clock CLK as is well known.

However, when the positive edge of the system clock CLK is used as the reference, the required output setup time $(t_{OS} = t_{CCmin} - t_{SACmax})$ is occasionally not met when $t_{CL}$ equals $t_{CLref(OH)}$. This case is illustrated in the timing diagram of FIG. 1C. In this situation, if the low level time of the system clock CLK which can assure the required $t_{OS}$ in generating the internal clock CLKDQ for data output buffers is denoted as '$t_{CLref(OS)}$', the following relationship is obtained:

$$t_{CLref(OS)} = t_{CLmin} + t_{DEL} - t_{SACmax} \qquad (6)$$

As explained above, when $t_{CL} > t_{CLref(OH)} > t_{CLref(OS)}$, the internal clock CLKDQ is generated with reference to the positive edge of the system clock CLK. However, it is difficult to generate the internal clock CLKDQ with reference to the positive edge of CLK when $t_{CLref(OS)} > t_{CLref(OH)}$. In this case, two situations should be taken into consideration: $t_{CLref(OS)} > t_{CL} >= t_{CLref(OH)}$; and $t_{CL} >= t_{CLref(OS)} > t_{CLref(OH)}$. In the former situation, it is necessary to delay the generation point of the internal clock CLKDQ by increasing $t_{ST}$ in proportion to a time given by $t_{CL} - t_{CLref(OH)}$. On the other hand, in the latter situation, it is possible to generate the internal clock CLKDQ with reference to the positive edge of the system clock CLK.

Now, assuming that the duty cycle is 50%, $t_{OH} \approx t_{CLmin}$, and $t_D (= t_{DEL} - t_{SACmax}) < t_{CLmin}$, the reference output hold clock low level time $t_{CLref(OH)}$ and the reference output setup clock low level time $t_{CLref(OS)}$ can be calculated by;

$$t_{CLref(OH)} \approx t_{SACmax} \approx t_{CCmin}$$

$$t_{CLref(OS)} < t_{CCmin}$$

Thus, it is expected that the relationship $t_{CLref(OH)} > t_{CLref(OS)}$ is satisfied.

Accordingly, a need remains for a technique for overcoming the problems of the prior art internal clock generation techniques.

SUMMARY OF THE INVENTION

Therefore, it is an object of the present invention to reduce the response time of an SDRAM.

Another object of the present invention is to reduce the response time of an SDRAM while assuring an adequate data hold time.

A further object of the present invention is to reduce the response time of an SDRAM while assuring an adequate data setup time.

To accomplish these and other objects, the applicant has invented a method and apparatus for generating an internal clock for an SDRAM device which can operate over a wide range of frequencies. The method for generating the internal clock changes in response to the operating frequency of an external system clock.

In a first embodiment, the internal clock is generated (1) with reference to the rising edge of the system clock when the system clock signal is relatively slow, and (2) with reference to the falling edge of the system clock when the system clock signal is relatively fast. The system clock signal is considered to be slow when the low time of the system clock is longer than a reference output hold clock low time $t_{CLref(OH)}$.

In a second embodiment, the internal clock is generated (1) with reference to the rising edge of the system clock when the system clock signal is relatively slow, (2) with reference to the falling edge of the system clock when the system clock signal is relatively fast, and (3) with reference to the falling edge of the system clock, but including a time delay, when the frequency of the system clock signal is in a moderate range. The system clock signal is considered to be slow when the low time of the system clock is longer than both a reference output hold clock low time $t_{CLref(OH)}$ and a reference output setup clock low time $t_{CLref(OS)}$. The clock signal is considered to be fast when the low time of the system clock is shorter than both $t_{CLref(OH)}$ and $t_{CLref(OS)}$, and moderate when the low time is longer then $t_{CLref(OH)}$ and shorter than $t_{CLref(OS)}$.

An advantage of the present invention is that it assures that the data output hold time is adequate regardless of the operating frequency of an external clock signal.

Another advantage of the present invention is that it assures that the data output setup time is adequate regardless of the operating frequency of an external clock signal.

One aspect of the present invention is an internal clock generating circuit for a data output buffer in an SDRAM device comprising:

an external clock input terminal through which an external clock, e.g., a system clock CLK for the SDRAMs is provided;

an internal clock output terminal for providing an internal clock signal for the data output buffer;

a reference pulse generator for receiving the external clock as its input signal and for producing a sequence of reference pulses, each pulse having a width corresponding to a reference output hold clock low level time $t_{CLref(OH)}$;

a clock rate detector for receiving the reference pulses and the external clock signal as its two input signals, and for providing an output signal denoting if the clock rate of the external clock signal is higher than the clock rate of the reference pulse;

a first internal clock generator for producing a first internal clock with reference to the positive edge of the external clock signal;

a second internal clock generator for producing a second internal clock with reference to the negative edge of the external clock signal;

a signal inverter for converting the signal level of the output of the clock rate detector;

a first switch for receiving the output of the clock rate detector and the output of the signal inverter, and for providing the external clock signal for the first internal clock generator in response to the output of the clock rate detector being in a first level or for providing the external clock signal for the second internal clock generator in response to the output of the clock rate detector being not in the first level; and a second switch for receiving the output of the clock rate detector and the output of the signal inverter, and for making the first internal clock from the first internal clock generator to be the internal clock signal for the data output buffer in response to a second level of the output of the clock rate detector or for making the second internal clock from the second internal clock generator to be the internal clock signal for the data output buffer in response to the output of the clock rate detector not being the second level.

Another aspect of the present invention is an internal clock generating circuit for a data output buffer comprising:

an external clock input terminal for receiving an external clock, e.g., a system clock CLK for the SDRAM devices;

an internal clock output terminal for providing an internal clock signal for data output buffer;

a first reference pulse generator for receiving the external clock signal and for producing a first sequence of reference pulses, each of the first reference pulse having a width corresponding to a reference output setup clock low level time $t_{CLref(OS)}$;

a second reference pulse generator for receiving the external clock signal and for producing a second sequence of reference pulses, each of the second reference pulse having a width corresponding to a reference output hold clock low level time $t_{CLref(OH)}$;

a first clock rate detector for receiving the first reference pulse signal and the external clock signal, and for producing two complementary output signals which denote if the clock rate of the external clock is higher than the clock rate of the first reference pulse signal;

a second clock rate detector for receiving the second reference pulse signal and the external clock signal, and for producing an output signal which denotes if the clock rate of the external clock signal is higher than the clock rate of the second reference pulse signal;

a clock rate decision element for receiving the outputs of the first and the second clock rate detectors, and providing a first rate signal for presenting if the external clock low level time $t_{CL}$ is greater than the $t_{CLref(OS)}$ and a second clock rate indication signal for representing if the $t_{CL}$ of the external clock signal is greater than the $t_{CLref(OH)}$ and is smaller than the $t_{CLref(OS)}$;

a first internal clock generator for generating a first internal clock signal with reference to the positive edge of the external clock signal;

a second internal clock generator for generating a second internal clock signal with reference to the negative edge of the external clock signal;

a delay control element for controlling the variable delay element in response to the first and the second clock rate signals of the clock rate decision element;

a first and a second signal inverters for converting the signal levels of the first and the second clock rate signals of the clock rate decision element;

a first switch receiving the first clock rate signal from the clock rate decision element and the output of the first signal inverter, for providing the external clock signal coming through the external clock input terminal for the first internal clock generator in response to the first clock rate signal being in a first signal level, or for providing the external clock signal for the second internal clock generator in response to the first clock rate signal being not the first signal level;

a second switch for receiving the first clock rate signal and the output of the first signal inverter, and for permitting the first internal clock signal from the first internal clock generator to become the internal clock signal CLKDQ for the data output buffer in response to the first clock rate signal being a second signal level, or making the second internal clock signal from the second internal clock generator to be the internal clock signal CLKDQ for the data output buffer in response to the first clock rate signal being not the second signal level; and a third switch for receiving the second clock rate signal and the output of the second signal inverter, and for providing the output of the delay control element for the variable delay controlling element in response to the second clock rate signal being a third signal level, or for providing the output of the delay controlling element for the variable delay element in response to the second clock rate signal being not the third signal level.

In one embodiment of the present invention, the variable delay element comprises a voltage controlled delay for delaying the external clock signal for a time proportional to the magnitude of an input voltage of the variable delay element. The delay controlling element comprises an input difference detector for producing a sequence of pulse signals, each of the pulses having a width corresponding to the difference of the low level duration times of the external clock signal and of the output of the second reference pulse generator, and a mean input difference control voltage generator for controlling the signal delay time by providing an average voltage signal of the pulse sequence signals for the voltage controlled delay element when the sequence of the pulse signals are provided through the third switch from the input difference detector.

The foregoing and other objects, features and advantages of the invention will become more readily apparent from the following detailed description of a preferred embodiment of the invention which proceeds with reference to the accompanying drawings.

DETAILED DESCRIPTION

FIGS. 2–6 show the construction and operation of exemplary embodiments of several components which are constructed in accordance with the present invention and which can be used to implement the first and second embodiments of internal clock generating circuits which are described below.

Figure 2:
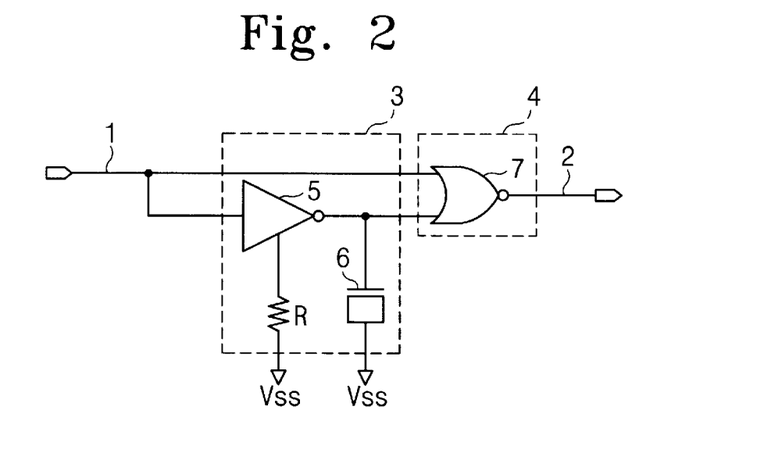
FIG. 2 is a schematic diagram of an exemplary embodiment of a reference pulse generating circuit constructed in accordance with the present invention.

FIG. 2 shows an embodiment of a reference pulse generator according to the present invention. The reference pulse generator generates, through an output terminal 2, a reference pulse signal RPLS having a predetermined pulse width. A pulse is generated whenever the system clock CLK, which is received through an input terminal 1, goes to a low level from a high level. The reference pulse generator comprises a delay element 3 for delaying the input signal for a predetermined time period and a pulse generating element 4. The delay element 3 may be implemented by an inverter 5 and a capacitor 6, while the pulse generating element 4 may be implemented by a NOR gate 7.

Even though FIG. 2 shows one inverter 5 and one capacitor 6 for the delay element 3, the delay element 3 can be comprised of odd numbered pairs of inverters and capacitors. With this configuration of the reference pulse generator, the output signal RPLS can be regulated to have the same pulse width as $t_{CLref(OH)}$ or $t_{CLref(OS)}$ by controlling the delay time of the delay element 3. In other words, it is possible to supply reference signals such as ref_oh and ref_os having pulse widths which correspond to $t_{CLref(OH)}$ and $t_{CLref(OS)}$, respectively, by using this reference pulse generator.

Figure 3:
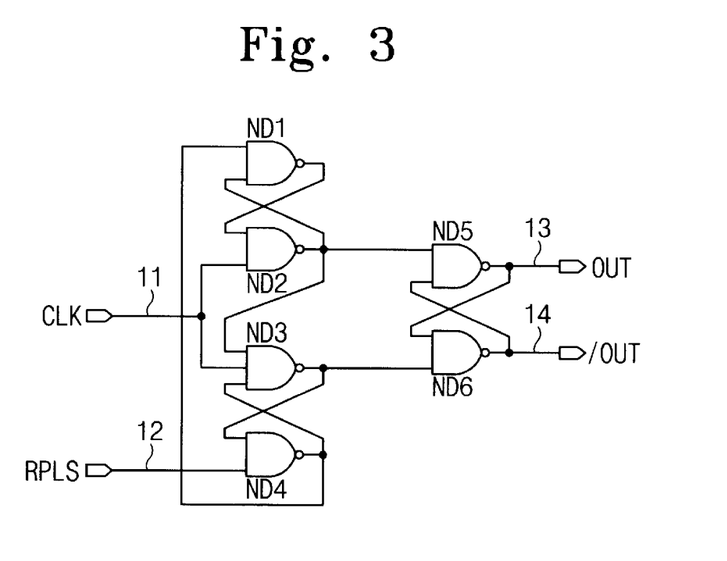
FIG. 3 is a schematic diagram of an embodiment of a clock rate detection circuit constructed in accordance with the present invention.

FIG. 3 shows a clock rate detecting circuit which detects the clock rate of the system clock CLK by identifying $t_{CL}$. The clock rate detecting circuit can be constructed using a phase detector. Referring to FIG. 3, the clock rate detecting circuit comprises a number of NAND gates ND1 to ND6 which are configured to function as a positive edge triggered D-type flip flop. The clock rate detecting circuit samples the reference pulse signal RPLS supplied through an input terminal 12 at the positive edge of the system clock CLK which is received at clock terminal 11. If the sampled value is '1', a data '1' is output as an output signal OUT through an output terminal 13, while, if the sampling result is logic zero, the output signal OUT and its inverted signal /OUT become '0' and '1', respectively. Accordingly, the clock low level time $t_{CL}$ of the system clock CLK can be calculated.

Figure 4:
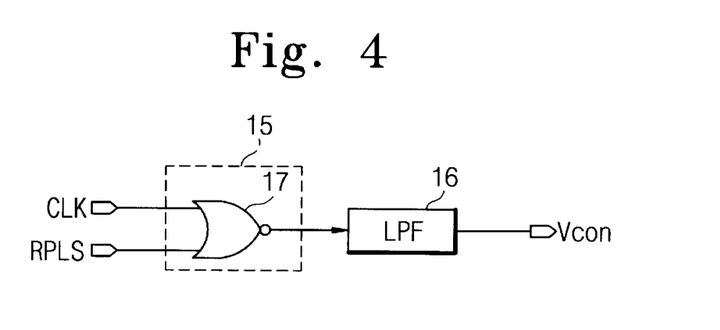
FIG. 4 is a schematic diagram of an embodiment of a control voltage generating circuit constructed in accordance with the present invention.

FIG. 4 shows a control voltage signal generating circuit that generates a signal having a magnitude proportional to the difference between two input pulse signals CLK and RPLS. The control voltage signal generating circuit comprises an input difference detector 15 and a mean input difference voltage signal generator 16. The input difference detector 15 comprising a NOR gate 17 and outputs a pulse sequence signal PTS. Each of the pulses of PTS has a pulse width corresponding to the difference between the duration times of the input pulse signals CLK and RPLS. The pulse sequence signal PTS is low-pass-filtered by the mean input difference voltage signal generator 16 so that the average of the pulse sequence signal PTS can be supplied as the control voltage signal Vcon for a voltage controlled delay circuit. The control voltage signal Vcon has a magnitude proportional to $|t_{CL}-t_{CLref(OH)}|$ when $t_{CLref(OS)}$ is greater than $t_{CLref(OH)}$.

Figure 5:
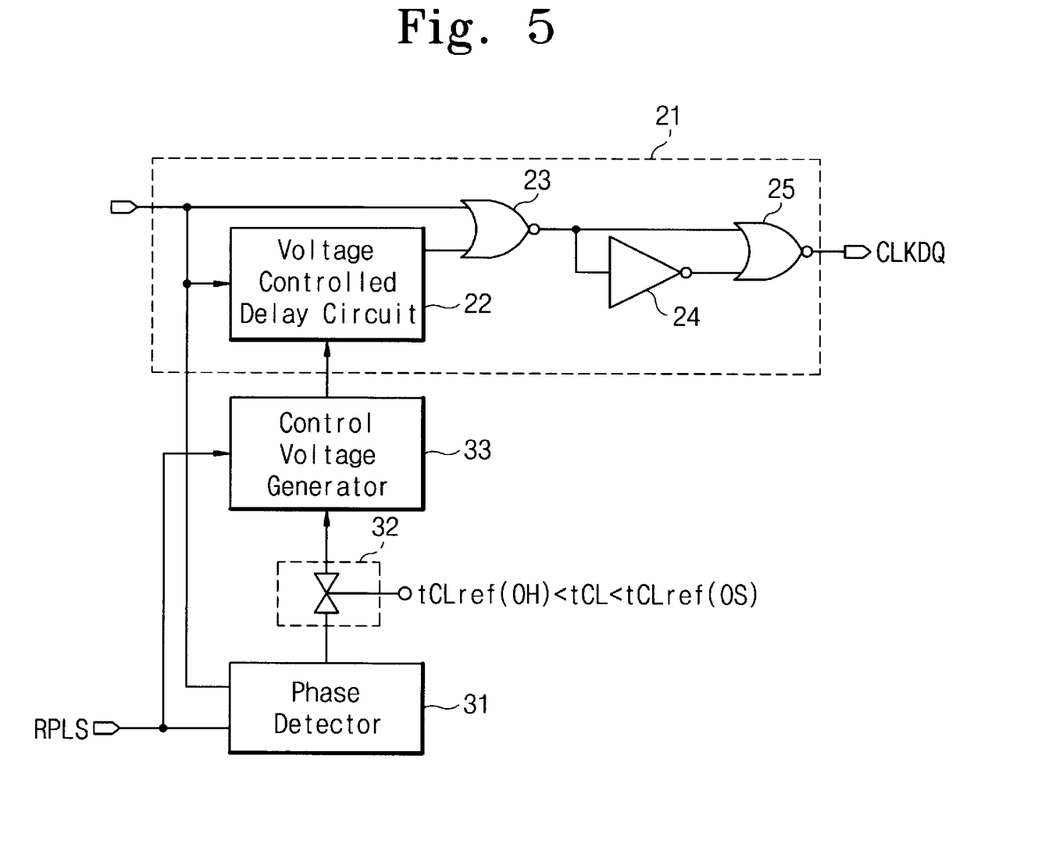
FIG. 5 is a schematic diagram of an embodiment of an internal clock generating circuit constructed in accordance with the present invention.

FIG. 5 shows an exemplary internal clock generating circuit 21 for generating an internal clock signal CLKDQ with reference to, and with a variable delay from, the negative edge of the system clock CLK. This circuit 21 comprises a voltage controlled delay circuit 22. In FIG. 5, reference numeral 31 represents the phase detector described above, and numerals 32 and 33 denote a switching circuit and a control voltage generating circuit, respectively. The control voltage generating circuit 33 delays the system clock CLK via the delay circuit 22 by providing the control voltage generating circuit with a mean input difference signal Vmean proportional to $|t_{CL}-t_{CLref(OH)}|$ as explained above. The switching circuit 32 is turned on only when $t_{CLref(OS)}>t_{CL}>=t_{CLref(OH)}$, so that the output signal from the phase detecting circuit 31 can be delivered to the control voltage generating circuit 33.

Figure 6A:
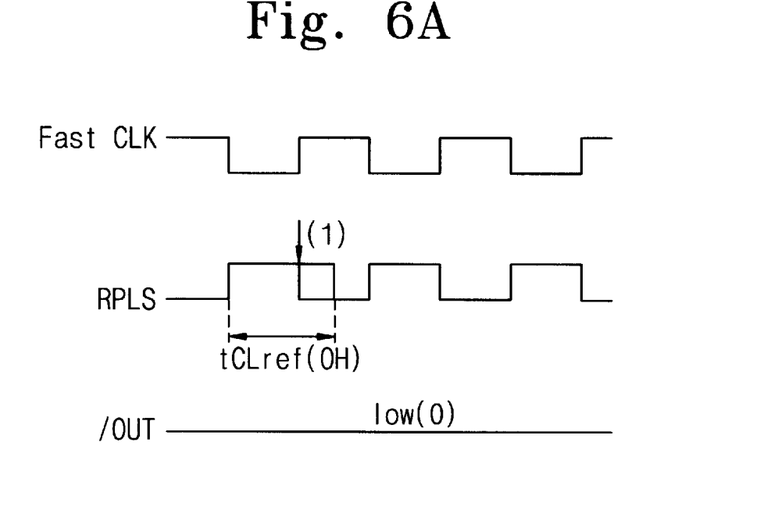
FIGS. 6A and 6B are timing diagrams showing the operation of an embodiment of a phase detection circuit and an embodiment of a control voltage generating circuit constructed in accordance with the present invention.
Figure 6B:
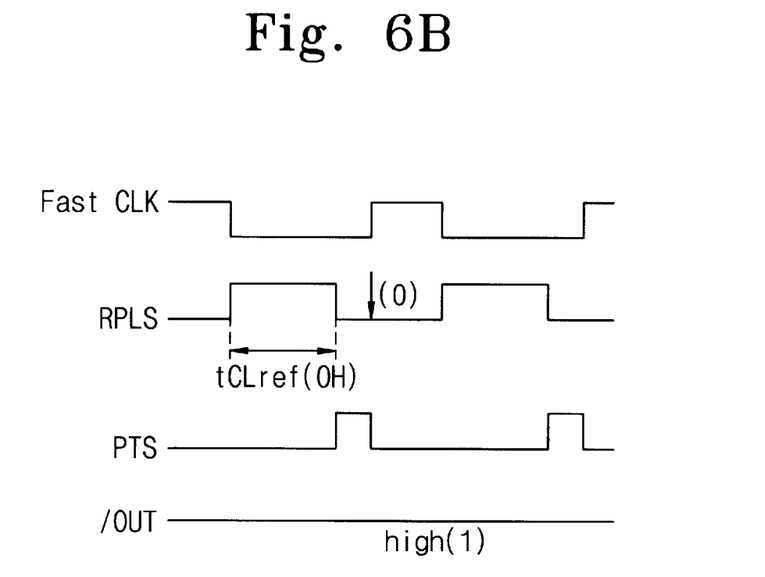

FIGS. 6A and 6B show output signals of the phase detecting circuit 31 and the input difference detector 15 within the control signal generating circuit 33. The output signals depend on the frequency of the system clock CLK. When the system clock is faster than the reference pulse signal RPLS (i.e., fast CLK is input), the inverted output OUT of the phase detector 31 remains low. On the other hand, when the system clock CLK is slower than the reference pulse signal RPLS, the inverted output /OUT of the phase detector 31 remains high and the input difference detector 15 of the control voltage generating circuit 33 generates a pulse sequence signal PTS comprising a plural-ity of pulses each of which has a constant pulse width corresponding to the difference between the low level duration times of the system clock CLK and of the reference pulse signal RPLS.

The circuit elements described so far can be modified and combined in accordance with the present invention to create internal clock generating circuits for a data output buffer as described below.

First Embodiment

Figure 7:
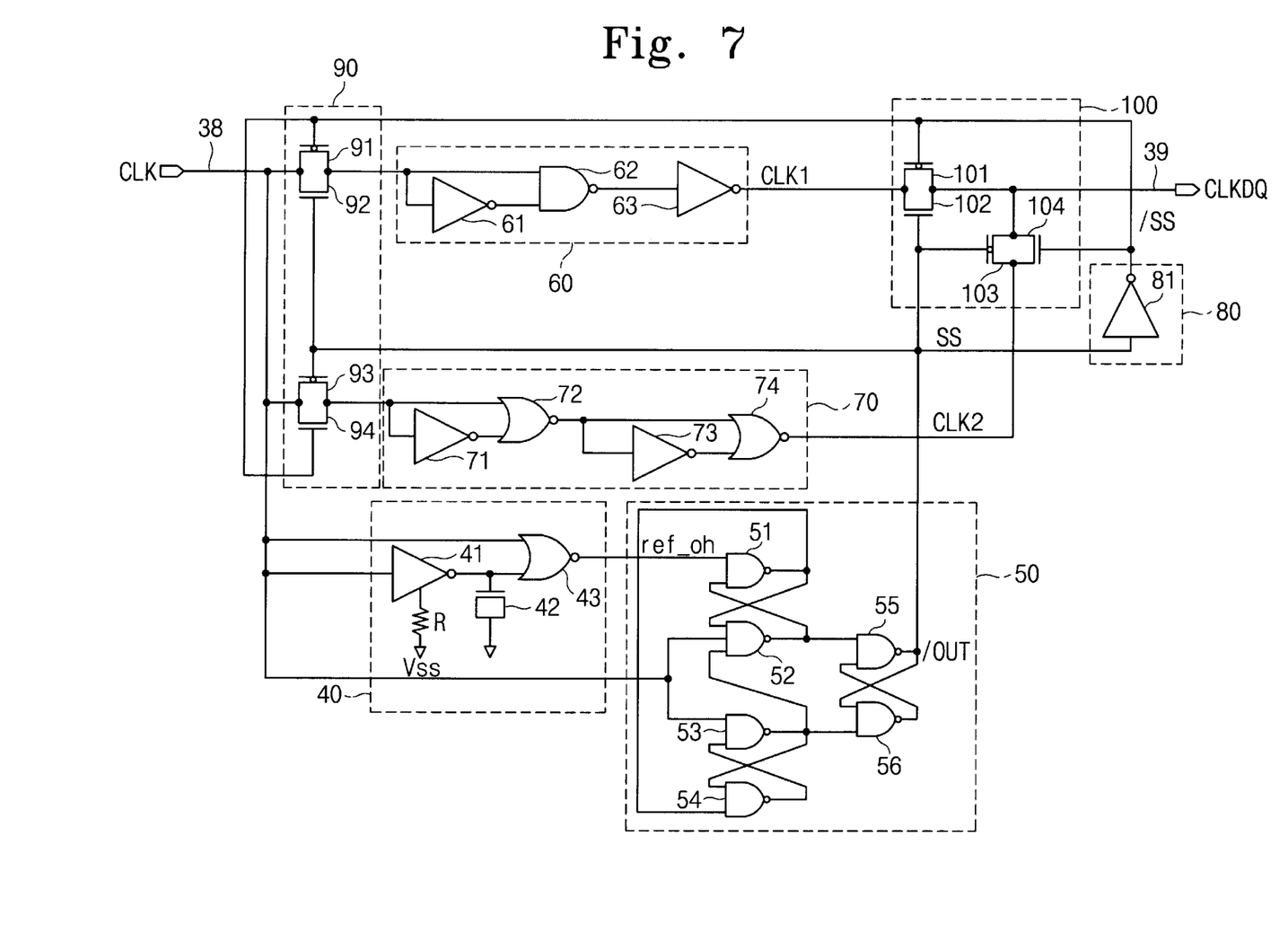
FIG. 7 is a schematic diagram of a first embodiment of an internal clock generating circuit for a data output buffer constructed in accordance with the present invention.

FIG. 7 shows a first embodiment of an internal clock generating circuit for a data output buffer in a synchronous DRAM. The circuit of FIG. 7 can be employed when $t_{CLref(OH)}$ is greater than $t_{CLref(OS)}$. The internal clock generating circuit of FIG. 7 comprises a reference pulse generator 40, a clock rate detector 50, a first internal clock generator 60, a second internal clock generator 70, a signal inverter 80, a first switch 90, and a second switch 100.

The reference pulse generator 40 receives the system clock CLK through an external clock input terminal 38, and produces a reference pulse signal ref_oh which has a pulse width corresponding to $t_{CLref(OH)}$. The reference pulse generator 40 includes an inverter 41 having an input connected to the external clock input terminal 38, a capacitor 42 having two nodes of which one is connected to an output of the inverter 41 and the other is connected to a ground terminal Vss, and a NOR gate 43 having two inputs of which one is connected to the external clock input terminal 38 and the other is connected to the output of the inverter 41. The inverter 41 of the reference pulse generator 40 can be replaced with an odd number of inverter and capacitor pairs.

The clock rate detector 50 receives, as its two inputs, the reference pulse signal ref_oh and the system clock CLK, and outputs an output signal SS which indicates whether the clock rate of the system clock CLK is higher or lower than the clock rate of the reference pulse ref_oh. This detector 50 is comprised of a positive edge triggered D-flip flop having an input terminal connected to the output of the NOR gate 43.

The first internal clock generator 60 generates the first internal clock CLK1 with reference to the positive edge of the system clock CLK. The first internal clock generator 60 comprises an inverter 61 for inverting the external system clock CLK, a NAND gate 62 having two inputs, one being connected to the input of the inverter 61 and the other being connected to the output of the inverter 61, and an inverter 63 having an input connected to the output of the NAND gate 62.

The second internal clock generator 70 generates the second internal clock CLK2 with reference to the negative edge of the system clock CLK. The second internal clock generator 70 comprises an inverter 71, a NOR gate 72 having two inputs respectively connected to the input and the output of the inverter 71, an inverter 73 having an input connected to the output of the NOR gate 72, and a NOR gate 74 having an input connected to the output of the inverter 73 and another input connected to the output of the NOR gate 72. The inverters 71 and 73 can be replaced by an odd number of inverters.

The signal inverter 80 is comprised of an inverter 81 and inverts the output signal SS of the clock rate detector 50.

The first switch 90 receives as input control signals the output signal SS of the clock rate detector 50 and the output signal /SS of the signal inverter 80. The switch 90 provides the system clock, which is received through the external clock input terminal 38, to the first internal clock generator 60 in response to a high level (or '1') on the output signal SS from the clock rate detector 50. The switch 90 provides the system clock CLK to the second internal clock generator 70 when the output signal SS of the clock rate detector 50 is low (or '0'). This switching element 90 comprises two pairs of transistors, each pair including a PMOS and an NMOS transistor. In one pair, the PMOS transistor 91 has a source connected to the external clock input terminal 38, a drain connected the input of the first internal clock generator 60 and a gate connected to the output of the signal inverter 80, while the NMOS transistor 92 has a source connected to the input of the first internal clock generator 60, a drain connected to the external clock input 38 and a gate connected to the output of the clock rate detector 50. In the other pair, the PMOS transistor 93 has a source connected to the external clock input terminal 38, a drain connected to the input of the second internal clock generator 70 and a gate connected to the output of the clock rate detector 50, while the NMOS transistor 94 has a source connected to the input of the second internal clock generator 70, a drain connected to the external clock input terminal 38 and a gate connected to the output of the signal inverter 80.

The second switch 100 receives, as input control signals, the output signal SS from the clock rate detector and the output signal SS from the signal inverter 80. The second switch couples the first internal clock signal CLK1 from the first internal clock generator 60 to the internal clock output terminal 39 when the output signal SS from the clock rage detector 50 is high. It couples the second internal clock signal CLK2 from the second internal clock generator 70 to the internal clock output terminal 39 when the output signal SS from the clock rage detector 50 is low.

The second switch 100 is comprised of two PMOS transistors 101 and 103, and two NMOS transistors 102 and 104. PMOS transistor 101 has a source connected to the output of the first internal clock generator 60, a drain connected to the internal clock output terminal 39, and a gate electrode connected to the output of the signal inverter 80. NMOS transistor 102 has a source connected to the internal clock output terminal 39, a drain connected to the output of the first internal clock generator 60, and a gate connected to the clock rate detector 50. PMOS transistor 103 has a source connected to the output of the second internal clock generator 70, a drain connected to the internal clock output terminal 39, and a gate connected to the output of the clock rate detector 50. And NMOS transistor 104 has a source connected to the internal clock output terminal 39, a drain connected to the output of the second internal clock generator 70, and a gate connected to the output of the signal inverter 80.

Figure 8A:
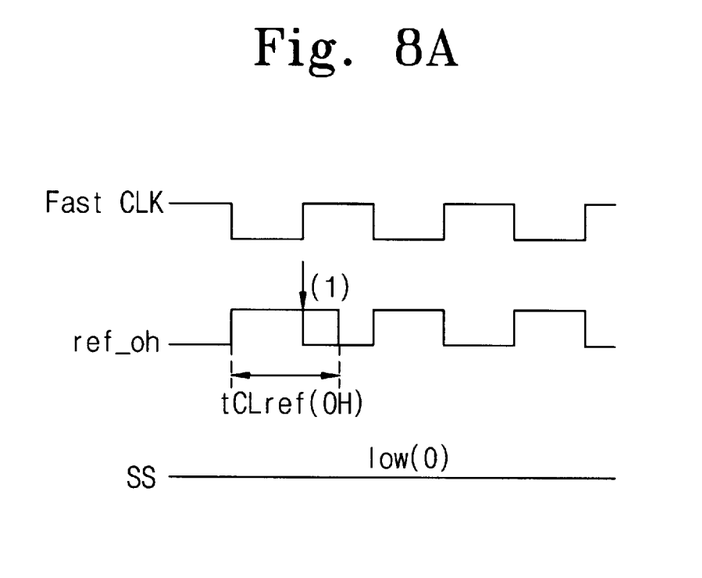
FIGS. 8A and 8B are timing diagrams showing the operation of the circuit if FIG. 7.

The operation of the internal clock generating circuit of FIG. 7 will now be described with reference to FIGS. 8A and 8B which show how the output of the clock rate detector 50 responds to variations of the clock rate of the system clock CLK when $t_{CLref(OH)}$ is greater than $t_{CLref(OS)}$.

The system clock CLK supplied to the reference pulse generator 40 is delayed by signal delay elements 41 and 42. The delayed clock signal and the original system clock CLK are both input to the NOR gate 43 so that the output reference pulse signal ref_oh of the NOR gate 43 has a pulse width equal to $t_{CLref(OH)}$. The delay time of the system clock CLK is adjusted to obtain the required value of $t_{CLref(OH)}$.

The reference pulse signal ref_oh from the reference pulse generator 40 is delivered to the input terminal of the clock rate detector 50 which includes D flip flops 51 to 56 which function as a phase detector. If the reference pulse signal ref_oh is high at the positive edge of the system clock CLK, the D flip flops 51 to 56 generate the output signal SS at a low through the inverted output terminal /OUT as shown in FIG. 8A. That is, when a relatively fast system clock Fast CLK is received, the clock rate detector 50 outputs a low level signal SS. This causes the transistors 93 and 94 of the first switch 90 and the transistors 103 and 104 of the second switch 100 to turn on. As a result, the second internal clock CLK2 which is produced by the second internal clock generator 70 at the negative edge of the system clock CLK becomes the internal clock CLKDQ which is output through the internal clock output terminal 39.

Figure 8B:
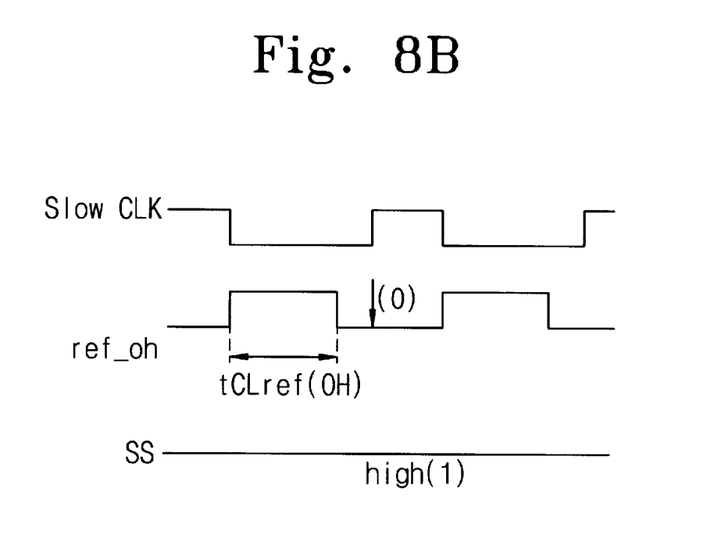

On the other hand, if the reference pulse signal ref_oh from the reference pulse generator 40 is low at the positive edge of the system clock CLK, i.e., if a slow system clock Slow CLK is received as shown in FIG. 8B, the clock rate detector 50 produces a high output signal SS. Thus, the transistors 91 and 92 of the first switch 90 and the transistors 101 and 102 of the second switch 100 turn on. As a result, the first internal clock CLK1 which is produced from the first internal clock generator 60 at the positive edge of the system clock CLK becomes the internal clock CLKDQ which is output through the internal clock output terminal 39.

Second Embodiment

Figure 9:
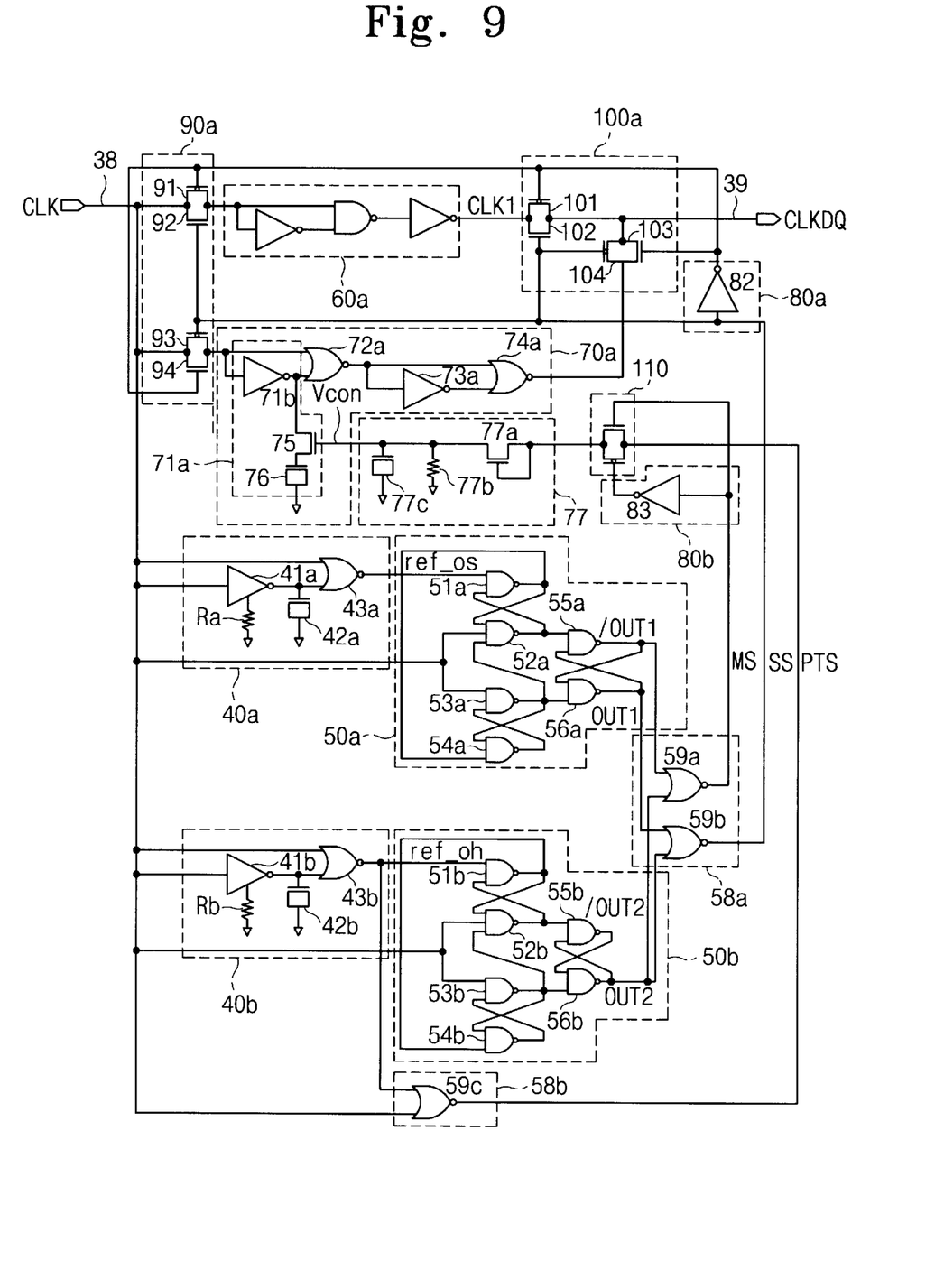
FIG. 9 is a schematic diagram of a second embodiment of an internal clock generating circuit for a data output buffer constructed in accordance with the present invention.

FIG. 9 shows a second embodiment of an internal clock generating circuit for a data output buffer in a synchronous DRAM. The circuit of FIG. 9 is intended for use when $t_{CLref(OH)}$ is less than $t_{CLref(OS)}$, but can also be used when $t_{CLref(OH)}$ is greater than $t_{CLref(OS)}$. The internal clock generating circuit shown in FIG. 9 comprises two reference pulse generators 40a and 40b, two clock rate detectors 50a and 50b, a clock rate decision element 58a, an input difference detector 58b, two internal clock generators 60a and 70a, a mean input difference control voltage generator 77, two signal inverters 80a and 80b, and three switches 90a, 100a and 110.

The first reference pulse generator 40a receives as an input signal the system clock CLK, and produces the first reference pulse signal ref_os having a pulse width corresponding to $t_{CLref(OS)}$. This reference pulse generator 40a includes an inverter 41a having an input terminal connected to the external clock input terminal 38, a capacitor 42a connected between the output of the inverter 41a and a ground terminal Vss, and a NOR gate 43a having two inputs, one of which is connected to the external clock input terminal 38, and the other of which is connected to the output of the inverter 41a. The inverter 41a and capacitor 42a of the reference pulse generator 40a can be replaced with an odd number of inverter-capacitor pairs.

The second reference pulse generator 40b receives the system clock CLK as its input signal and generates the second reference pulse signal ref_oh having a pulse width corresponding to $t_{CLref(OH)}$. This reference pulse generator 40b, like the first reference pulse generator 40a, includes an inverter 41b having an input terminal connected to the external clock input terminal 38, a capacitor 42b connected between the output of the inverter 41b and the ground terminal Vss, and a NOR gate 43b having two inputs, one of which is connected to the external clock input terminal 38, and the other of which is connected to the output of the inverter 41a. The inverter 41b and capacitor 42b of the reference pulse generator 40a can be replaced with an odd number of inverter-capacitor pairs.

The first clock rate detector 50a receives the first reference pulse signal ref_os and the system clock CLK as its input signals, and outputs two complementary output signals that indicate whether the clock rate of the system clock CLK is greater or less than the clock rate of the first reference pulse signal ref_os. When the system clock is faster than the first reference pulse signal ref_os, the first clock rate detector 50a outputs a high level output signal through the output terminal OUT1 and a low level output signal through the complementary output terminal /OUT1. The first clock rate detector 50a is comprised of a positive edge triggered D flip flop having an input connected to the output of the NOR gate 43a of the first reference pulse generator 40a.

The second clock rate detector 50b receives the second reference pulse signal ref_oh and the system clock CLK as its two input signals, and outputs an output signal that indicates whether the clock rate of the system clock CLK is greater or less than the clock rate of the first reference pulse signal ref_oh. The second clock rate detector 50b comprises a positive edge triggered D flip flop having an input terminal connected to the output of the NOR gate 43b of the second reference pulse generator 40b. If the system clock is faster than the second reference pulse signal ref_oh, the second clock rate detector outputs a high level output signal through the output terminal OUT2 and outputs a low level output signal through the complementary output terminal /OUT2.

The clock rate decision element 58a, which receives the outputs of the first and the second clock rate detectors 50a and 50b, outputs the first clock rate signal SS which indicates whether $t_{CL}$ of the system clock CLK is greater or less than $t_{CLref(OS)}$, and outputs the second clock rate indication signal MS which indicates whether $t_{CL}$ of the system clock CLK is greater than $t_{CLref(OH)}$ and less than $t_{CLref(OS)}$. The clock rate decision element 58a comprises a NOR gate 59a having two inputs of which one is connected to the complementary output terminal /OUT1 of the first clock rate detector 50a, and the other is connected to the output terminal OUT2 of the second clock rate detector 50b. The clock rate decision element 58a also includes a NOR gate 59b having two inputs of which one input is connected to the output terminal OUT1 of the first clock rate detector 50a and the other input is connected to the output terminal OUT2.

The input difference detector 58b comprises one NOR gate 59c, and produces a pulse sequence signal PTS of which each pulse has a width corresponding to the difference of the low level duration times of the outputs of the system clock CLK and of the second reference pulse generator 40b.

The first internal clock generator 60a generates the first internal clock CLK1 with reference to the positive edge of the system clock CLK. The configuration of the first internal clock generator 60a is the same as the counterpart of the first embodiment.

The second internal clock generator 70a comprises a voltage controlled delay 71a, and produces the second internal clock CLK2 with reference to the negative edge of the system clock CLK. This second internal clock generator 70a has a similar identical structure to that of the first embodiment except that it also includes a delay element which comprises an inverter 71b for inverting the system clock supplied from the first switch, a MOS transistor 75 which has a drain (or a source) connected to the output of the inverter 71b, and a gate connected to a low pass filter. The delay element also includes a capacitor 76 connected between the drain (or the source) of the MOS transistor 75 and the ground terminal. The transistor 75 of the delay element functions to charge the capacitor 76 to a level corresponding to a gate voltage.

The first and the second signal inverters 80a and 80b invert the values of the first and the second clock rate signals SS and MS of the clock rate decision element 58a.

The first signal inverter 80a comprises an inverter 82 having an input terminal connected to the output of the NOR gate 59b of the clock rage decision element 58a, and the second signal inverter 80b includes an inverter 83 having an input terminal is connected to the output of the NOR gate 59a of the clock rate decision element 58a.

The first switch 90a receives, as its two control input signals, the first clock rate signal SS from the clock rate decision element 58a and the output signal SS from the first signal inverter 80a. The first switch 90a couples the system clock CLK to the first internal clock generator 60a in response to a high level on the first clock rate signal SS and couples the system clock CLK to the second internal clock generator 70a in response to a low level on the first clock rate signal SS.

The second switch 100a receives the first clock rate signal SS and the output/SS of the first signal inverter 80a as its two input signals and couples the first internal clock signal CLK1 from the first internal clock generator 60a to the internal clock output terminal 39 as the internal clock signal CLKDQ for the data output buffer in response to a high level on the first clock rate signal SS. The second switch 100a couples the second internal clock signal CLK2 from the second internal clock generator 70a to the internal clock output terminal 39 as the internal clock signal CLKDQ for the data output buffer in response to a low level on the first clock rate signal SS.

The mean input difference control voltage signal generator 77 provides the voltage controlled delay 71a of the second internal clock generator 70a with a mean voltage signal Vcon in response to the pulse sequence signal PTS from the input difference detector 58b so as to set the delay time. (When the difference of the low level duration times of the two inputs changes, the pulse width of the signal PTS varies accordingly.) The mean input difference control voltage generator 77 comprises low pass filters 77b and 77c.

The third switch 110 receives the second clock rate signal MS and the output signal /MS from the second signal inverter 80b and couples the pulse sequence signal PTS from the input difference detector 58b to the mean input difference control voltage generator 77 when the second clock rate signal MS is low. The pulse sequence signal PTS is cut off from the mean input difference control voltage generator 77 when the second clock rate signal MS is high. The third switch 110 is comprised of a CMOS transmission gate having a conduction path between the output of the clock rate decision element 58a and the input of the mean input difference control voltage generator 77. In the transmission gate, an NMOS transistor has a gate electrode for receiving the second clock rate signal MS and a PMOS transistor has a gate electrode for receiving the inverted signal /MS of the second clock rate signal MS.

Figure 10A:
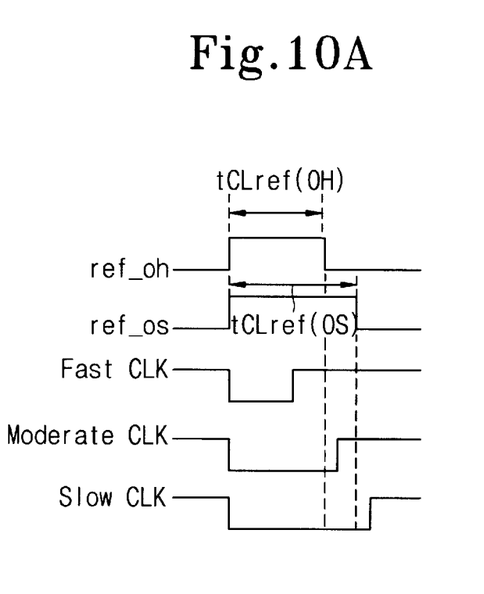
FIGS. 10A–10D are timing diagrams showing the operation of the circuit if FIG. 9.
Figure 10B:
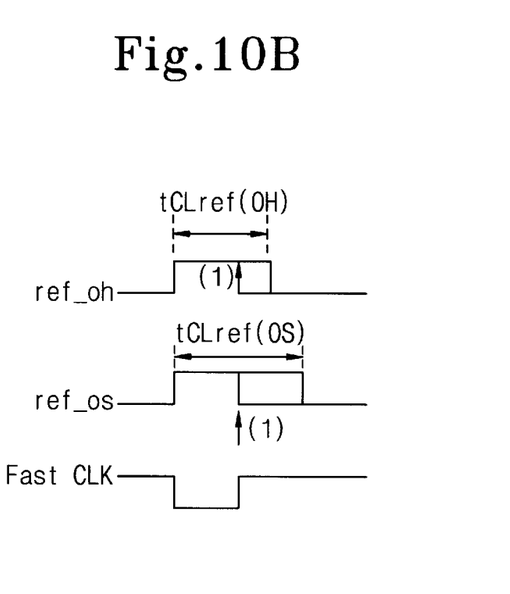
Figure 10C:
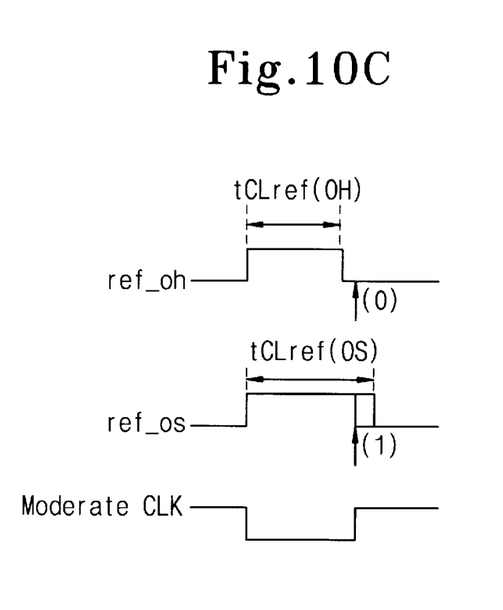
Figure 10D:
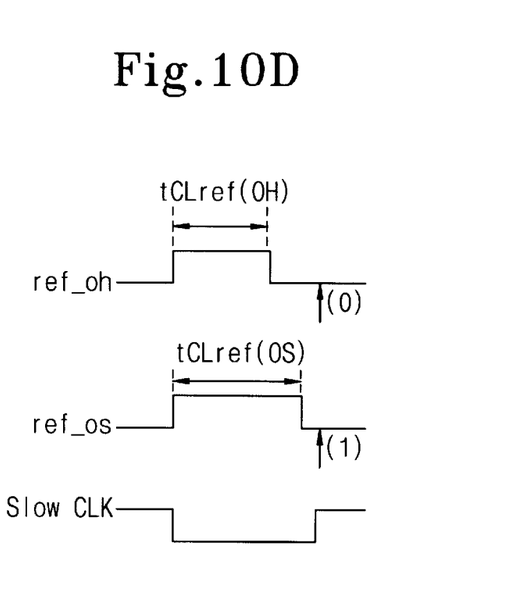

FIGS. 10A and 10D show how the output signals from the clock rate detectors 50a and 50b vary in response to the clock rate of the system clock CLK when $t_{CLref(OH)}$ is less than $t_{CLref(OS)}$. Referring to FIG. 10A, the system clock is referred to as fast if the system Fast CLK has a low level hold time $t_{CL}$ that is shorter than the reference output hold clock low level time $t_{CLref(OH)}$. When the low level time tCL is between the reference output hold time $t_{CLref(OS)}$ and the reference output setup clock low level time $t_{CLref(OS)}$, the system clock Moderate CLK is referred to as moderate, while if the low level time $t_{CL}$ is greater than the reference output setup clock low level time $t_{CLref(OS)}$, the system clock Slow CLK is referred to as slow.

The operation of the circuit of FIG. 9 will be described with reference to FIGS. 10B to 10D. First, when the first reference pulse signal ref__os from the first reference pulse generator 40a is high at the positive edge of the system clock CLK, the first clock rate detector 50a outputs a high signal through the terminal OUT1 and a low signal through the complementary output terminal /OUT1. The second clock rate detector 50b outputs a high level output signal through the output terminal OUT2 and a low level output signal through the complementary output terminal /OUT2 when the second reference pulse generator 40b provides a high level of the second reference pulse signal ref__oh at the positive edge of the system clock CLK.

As shown in FIG. 10B, if the output signals from the terminals OUT1 and OUT2 of the first and the second clock rate detectors 50a and 50b are both high, the clock rate decision element 58a concludes that a fast clock signal Fast CLK is input, and thus drives both the first clock rate signal SS and the second clock rate signal MS to a low level. Therefore, the transistors 93 and 94 of the first switch 90 and the transistors 103 and 104 of the second switch 100 turn on. As a result, the second internal clock CLK2 generated from the second internal clock generator 70 at the negative edge of the system clock CLK is output through the internal clock output terminal 39 as a final internal clock CLKDQ for the data output buffer.

Referring to FIG. 10C, if the output terminal OUT1 of the first clock rate detector 50a is at a high level and the terminal OUT2 of the second clock rate detector 50b is at a low level, the clock rate decision element 58a regards this system clock Moderate CLK as moderate and thus drives both the first clock rate signal SS and the second clock rate signal MS to a high level. This allows the transistors 93 and 94 of the first switch 90 and the transistors 103 and 104 of the second switch 100 to turn on and places the third switch 110 in a conductive state. As a result, the second internal clock CLK2 provided by the second internal clock generator 70 at the negative edge of the system clock CLK becomes the final internal clock CLKDQ for the data output buffer. However, the generating point of the second internal clock CLK2 is determined by the output voltage signal Vcon of the mean input difference control voltage generator 77. Thus, if the voltage signal Vcon of the mean input difference control voltage generator 77 has relatively high level, the generating point of the second internal clock CLK2 is delayed, and vice verse.

Referring to FIG. 10D, if the output signals from the terminals OUT1 and OUT2 of the first and the second clock rate detectors 50a and 50b are both low, the clock rate decision element 58a decides that the system clock Slow CLK is slow and, therefore, drives the first clock rate signal SS high and the second clock rate signal MS low. By doing this, the transistors 91 and 92 of the first switch 90 and the transistors 101 and 102 of the second switch 100 turn on. As a result, the second internal clock CLK2 from the second internal clock generator 70 at the positive edge of the system clock CLK is provided to the data output buffer as the final internal clock CLKDQ through the internal clock output terminal 39.

Having described and illustrated the principles of the invention in a preferred embodiment thereof, it should be apparent that the invention can be modified in arrangement and detail without departing from such principles. I claim all modifications and variations coming within the spirit and scope of the following claims.

What is claimed is:

1. A clock generation circuit for a data output buffer of a synchronous memory device, said clock generation circuit comprising:

a reference pulse generating means for generating, in response to an external clock signal, a reference pulse signal having a pulse width corresponding to a reference output hold time;

a clock rate detecting means for comparing a clock rate of the reference pulse signal with a clock rate of the external clock signal;

a first internal clock generating means for generating a first internal clock with reference to a first edge of the external clock signal;

a second internal clock generating means for generating a second internal clock with reference to a second edge of the external clock signal; and a switching means for responding to output signals from the clock rate detecting means and for outputting one of the first and the second internal clock signals.

2. A clock generation circuit for a data output buffer of a synchronous memory device, said clock generation circuit comprising:

a first reference pulse generating means for generating, in response to an external clock signal, a first reference pulse signal corresponding to a reference output setup time;

a second reference pulse generating means for generating, in response to an external clock signal, a second reference pulse signal corresponding to a reference output hold time;

a first clock rate detecting means for comparing a clock rate of the first reference pulse and a clock rate of the external clock signal;

a second clock rate detecting means for comparing a clock rate of the second reference pulse signal and the clock rate of the external clock signal;

a clock rate decision means for receiving outputs of the first and the second clock rate detecting means, and for producing a first clock rate signal when the clock rate of the external clock signal is higher than the clock rate of the first reference pulse signal, and producing a second clock rate signal when the clock rate of the external clock signal is higher than the clock rate of the first reference pulse signal and lower than the clock rate of the second reference pulse signal;

a first internal clock generating means for generating a first internal clock signal in response to a first edge of the external clock signal;

a second internal clock generating means for generating a second internal clock signal in response to a second edge of the external clock signal, the second internal clock generating means including a variable delay means;

a delay control means for controlling the variable delay means in response to the external clock signal and to the second reference pulse signal;

a first switching means for selectively providing the first internal clock signal and the second internal clock signal as an internal clock signal to the data output buffer in response the first clock rate signal; and a second switching means for providing the output of the delay control means to the variable delay means in response to the second clock rate signal.

3. The clock generation circuit as claimed in claim 2, wherein the variable delay means comprises a voltage controlled delay means for delaying the external clock signal for a delay time proportional to a magnitude of the input voltage.

4. The clock generation circuit as claimed in claim 3, wherein the delay control means comprises:

an input difference detecting means for producing a sequence of pulse signals, each of the pulse signal having a width corresponding to the difference between the low level duration times of the external clock signal and of the second reference pulse generating means; and a mean input difference control voltage generating means for controlling the voltage controlled delay means.

5. The clock generation circuit as claimed in claim 4, wherein the mean input difference control voltage generating means comprises a low pass filter.

6. The clock generation circuit as claimed in claim 2, wherein each of the first and the second reference pulse generating means comprises:

an inverter having an input coupled to receive the external clock signal;

a capacitor having a first input connected to an output of the first inverting means and a second input connected to a ground voltage terminal; and a NOR gate having a first input connected to the output of the first inverting means and a second input coupled to receive the external clock signal.

7. A method for generating a buffer clock signal for a synchronous memory device comprising:

detecting an operating characteristic of an external clock signal;

selecting an edge of the external clock signal responsive to the detected operating characteristic; and generating the buffer clock signal responsive to the selected edge of the external clock signal.

8. A method according to claim 7 wherein detecting the operating characteristic of the external clock signal includes detecting the operating speed of the external clock signal.

9. A method according to claim 7 wherein detecting the operating characteristic of the external clock signal includes detecting an inactive time of the external clock signal.

10. A method according to claim 7 wherein detecting the operating characteristic of the external clock signal includes comparing the external clock signal to a first reference signal.

11. A method according to claim 10 further including generating the first reference signal responsive to the external clock signal.

12. A method for generating a buffer clock signal for a synchronous memory device comprising:

detecting an operating characteristic of an external clock signal;

selecting an edge of the external clock signal responsive to the detected operating characteristic; and generating the buffer clock signal responsive to the selected edge of the external clock signal;

wherein detecting the operating characteristic of the external clock signal further includes comparing the external clock signal to a second reference signal.

13. A method for generating a buffer clock signal for a synchronous memory device comprising:

detecting an operating characteristic of an external clock signal;

selecting an edge of the external clock signal responsive to the detected operating characteristic;

generating the buffer clock signal responsive to the selected edge of the external clock signal; and delaying the buffer clock signal responsive to the operating characteristic of the external clock signal.

14. A method for generating a buffer clock signal for a synchronous memory device comprising:

detecting an operating characteristic of an external clock signal;

selecting an edge of the external clock signal responsive to the detected operating characteristic; and generating the buffer clock signal responsive to the selected edge of the external clock signal;

wherein selecting an edge of the external clock signal includes:

selecting a first edge if the detected operating characteristic is in a first range; and selecting a second edge if the detected operating characteristic is not in the first range.

15. A method according to claim 14 further including delaying the buffer clock signal if the detected operating characteristic is in a second range.

16. A circuit for generating a buffer clock signal for a synchronous memory device comprising:

a first clock generator (60) having an input terminal coupled to receive an external clock signal and an output terminal for generating a first internal clock signal responsive to the external clock signal, wherein the first clock generator generates the first internal clock signal at the same frequency as the external clock signal and with reference to a first edge of the external clock signal;

a second clock generator (70) having an input terminal coupled to receive the external clock signal and an output terminal for generating a second internal clock signal responsive to the external clock signal, wherein the second clock generator generates the second internal clock signal at the same frequency as the external clock signal and with reference to a second edge of the external clock signal;

a switch (100) having a first input terminal coupled to the output terminal of the first clock generator, a second input terminal coupled to the output terminal of the second clock generator, an output terminal for transmitting the buffer clock signal, the switch selecting the first or second internal clock signals responsive to a select signal; and a detector circuit (50) having a first input terminal coupled to receive the external clock signal, a second input terminal coupled to receive a reference signal, and an output terminal for transmitting the select signal.

17. A circuit according to claim 16 further including a reference signal generator (40) having an input terminal coupled to receive the external clock signal and an output terminal coupled to the second input terminal of the detector circuit.

18. A circuit for generating a buffer clock signal for a synchronous memory device comprising:

a first clock generator (60) having an input terminal coupled to receive an external clock signal and an output terminal for generating a first internal clock signal responsive to the external clock signal;

a second clock generator (70) having an input terminal coupled to receive the external clock signal and an output terminal for generating a second internal clock signal responsive to the external clock signal;

a switch (100) having a first input terminal coupled to the output terminal of the first clock generator, a second input terminal coupled to the output terminal of the second clock generator, an output terminal for transmitting the buffer clock signal, the switch selecting the first or second internal clock signals responsive to a select signal;

a detector circuit (50) having a first input terminal coupled to receive the external clock signal, a second input terminal coupled to receive a reference signal, and an output terminal for transmitting the select signal;

a delay circuit (71*a*) coupled to the second clock generator for delaying the second internal clock signal responsive to a control signal; and a control signal generator (77) coupled to the delay circuit to generate the control signal responsive to a difference signal.

19. A circuit according to claim 18, further including:

a second switch (110) having an input terminal coupled to receive the difference signal, an output terminal coupled to an input terminal of the control signal generator, the second switch selecting the difference signal responsive to a second select signal;

a second detector circuit (50*a*) having a first input terminal coupled to receive the external clock signal, a second input terminal coupled to receive a second reference signal, and an output terminal for transmitting the second select signal; and a decision element (58*a*) coupled between the detector circuits and the switches to control the switches responsive to the select signals.

20. A circuit according to claim 19 further including:

a first reference signal generator (40*a*) having an input terminal coupled to receive the external clock signal and an output terminal coupled to the second input terminal of the detector circuit;

a second reference signal generator (40*b*) having an input terminal coupled to receive the external clock signal and an output terminal coupled to the second input terminal of the second detector circuit; and a difference detector (58*b*) having a first input terminal coupled to receive the external clock signal, a second input terminal coupled to the output terminal of the second reference signal generator, and an output terminal for generating the difference signal.

\* \* \* \* \*